(12) United States Patent
Schubert et al.

(10) Patent No.: US 10,840,676 B2
(45) Date of Patent: Nov. 17, 2020

(54) OPTOELECTRONIC DEVICES HAVING SPATIALLY VARYING DISTRIBUTION OF QUANTUM CONFINED NANOSTRUCTURES

(71) Applicant: X Development LLC, Mountain View, CA (US)

(72) Inventors: Martin Friedrich Schubert, Mountain View, CA (US); Michael Jason Grundmann, San Jose, CA (US); Jesse Lu, East Palo Alto, CA (US); Brian John Adolf, San Mateo, CA (US)

(73) Assignee: X Development LLC, Mountain View, CA (US)

( * ) Notice: Subject to any disclaimer, the term of this patent is extended or adjusted under 35 U.S.C. 154(b) by 407 days.

(21) Appl. No.: 15/976,760

(22) Filed: May 10, 2018

(65) Prior Publication Data

US 2019/0348820 A1 Nov. 14, 2019

(51) Int. Cl.
*H01S 5/50* (2006.01)
*H01S 5/34* (2006.01)
*B82Y 20/00* (2011.01)

(52) U.S. Cl.
CPC .............. *H01S 5/50* (2013.01); *H01S 5/341* (2013.01); *B82Y 20/00* (2013.01)

(58) Field of Classification Search
CPC ....... H01S 5/341; H01S 5/3412; H01S 5/3421
See application file for complete search history.

(56) References Cited

U.S. PATENT DOCUMENTS

| | | | | |
|---|---|---|---|---|
| 10,181,495 | B1 * | 1/2019 | Schubert | C25F 3/12 |
| 2011/0181945 | A1 * | 7/2011 | Nishi | H01S 5/341 |
| | | | | 359/344 |
| 2018/0337514 | A1 * | 11/2018 | Tang | H01S 5/34333 |
| 2020/0028026 | A1 * | 1/2020 | Zhang | H01S 5/343 |

OTHER PUBLICATIONS

Ribeiro et al. "An optical study of self-assembled InxGa1-xAs/GaAs quantum dots embedded in a two-dimensional electron gas", Journal of Applied Physics 87, 7994 (May 16, 2000) (Year: 2000).*
Thon et al., "Strong Coupling Through Optical Positioning of a Quantum Dot in a Photonic Crystal Cavity," Applied Physics Letters 94, 111115, dated Mar. 20, 2009, 3 pages.

* cited by examiner

*Primary Examiner* — Eric L Bolda
(74) *Attorney, Agent, or Firm* — Fish & Richardson P.C.

(57) ABSTRACT

An optical device that includes: a base layer; a first region supported by the base layer, the first region including a first plurality of quantum-confined nanostructures and having a first density of quantum-confined nanostructures; a second region supported by the base layer, the first and second regions being non-overlapping regions, the second region having a second density of quantum-confined nanostructures lower than the first density; and an optical confinement structure supported by the base layer and configured to guide at least one transverse optical mode between a first end and a second end of the optical confinement structure. The first region substantially overlaps with the at least one transverse optical mode, and the first density varies across a cross-section of the optical device.

20 Claims, 4 Drawing Sheets

OPTOELECTRONIC DEVICES HAVING SPATIALLY VARYING DISTRIBUTION OF QUANTUM CONFINED NANOSTRUCTURES

TECHNICAL FIELD

This disclosure generally relates to optoelectronic devices and methods of making the optoelectronic devices.

BACKGROUND

A quantum-confined nanostructure is a nanostructure formed from a conducting or semiconducting material, such as compound semiconductors. A quantum dot is an example of a quantum confined nanostructure. A quantum dot typically ranges from 2 to 50 nm in dimension, a scale in which effects of quantum confinement of electrons or holes affect the overall characteristics of the nanostructure in significant ways. The effects of quantum confinement can be harnessed in various ways. For example, a quantum dot can be used to implement a qubit for quantum computing, such as a spin qubit or a charge qubit, by trapping a single electron within the quantum dot. As another example, an emission and absorption wavelength of the quantum dot can be modified from those of the bulk constituent material by changing the dimension of the quantum dot.

SUMMARY

This disclosure features various types of optoelectronic devices such as semiconductor optical amplifiers, lasers, and photodetectors having quantum-confined (QC) nanostructures at preset locations in preset densities. A QC nanostructure is formed from a conducting or semiconducting material, such as compound semiconductors. Examples of QC nanostructures include quantum dots, quantum dashes, quantum wells, and quantum wires. QC nanostructures can be used, for example, to provide optical gain or absorb light.

Typically, QC nanostructures are blanket-grown over a substrate, and devices such as optical amplifiers, lasers, and photodetectors are formed on the blanket layer of QC nanostructures. In some cases, it may be advantageous to selectively grow or etch the QC nanostructures in some regions using various techniques described in U.S. application Ser. No. 15/851,583 and U.S. application Ser. No. 15/851,602 titled "Multi-color monolithic light-emitting diodes and methods for making the same," which are incorporated by reference herein in their entirety.

For example, in the case of a semiconductor optical amplifier (SOA) formed from the QC nanostructures, QC nanostructures are electrically pumped such that the nanostructures provide optical gain. Only the nanostructures that overlap with the optical mode of the SOA contribute to the amplification operation of the SOA. As such, electrical energy consumed in pumping the QC nanostructures not in overlap with the optical mode is wasted, reducing the power efficiency of the SOA. Therefore, it may be advantageous to selectively remove QC nanostructures in regions that have low modal overlap with the optical mode of the SOA, or selectively grow QC nanostructures in regions that have high modal overlap with the optical mode.

As another example, in case of a photodetector formed from the QC nanostructures, QC nanostructures may generate dark current even when they do not absorb any light. As such, QC nanostructures that do not overlap with the optical mode of the photodetector contribute to dark current while not absorbing any light to generate photocurrent. Therefore, it may be similarly advantageous to selectively remove QC nanostructures in regions that have low modal overlap with the optical mode of the photodetector, or selectively grow QC nanostructures in regions that have high modal overlap with the optical mode.

Spatially selective growth or removal of QC nanostructures can be further leveraged to vary a density of the QC nanostructures within an optoelectronic device for various advantageous effects. For example, a nanostructure density can be varied along a light propagation direction within the semiconductor optical amplifier to decrease nonlinearity or improve saturation performance. As another example, a nanostructure density can be varied along a gain medium of a laser cavity such that the density of the QC nanostructures follows the peak intensities of a standing wave of the laser cavity, which can enable longitudinal mode-selective lasing. Similarly, the nanostructure density can be varied across a cross-section that is orthogonal to the propagation direction of a gain medium, which may enable transverse mode-selective lasing.

In general, in a first aspect, the disclosure features an optical device that includes: a base layer; a first region supported by the base layer, the first region including a first plurality of quantum-confined nanostructures and having a first density of quantum-confined nanostructures; a second region supported by the base layer, the first and second regions being non-overlapping regions, the second region having a second density of quantum-confined nanostructures lower than the first density; and an optical confinement structure supported by the base layer and configured to guide at least one transverse optical mode between a first end and a second end of the optical confinement structure. The first region substantially overlaps with the at least one transverse optical mode, and the first density varies across a cross-section of the optical device.

Embodiments of the optical device can include one or more of the following features. For example, the cross-section can be a longitudinal cross-section of the optical device, the longitudinal cross-section being parallel to a propagation direction of the at least one transverse optical mode, and the first density of quantum-confined nanostructures can vary along the propagation direction of the at least one transverse optical mode. The first density can increase or decrease along the propagation direction of the at least one transverse optical mode in at least a portion of the first region. The first region can include a plurality of sub-regions having different densities of quantum-confined nanostructures, and the optical device can further include a plurality of electrodes electrically coupled to the plurality of sub-regions.

In some embodiments, the optical device can further include: a first reflector disposed at the first end of the optical confinement structure and a second reflector disposed at the second end of the optical confinement structure. The first and second reflectors are configured to reflect at least some incident light at a first wavelength and form an optical cavity having at least one longitudinal optical mode. The first and second reflectors can be arranged along a direction orthogonal to a surface of the base layer. The first and second reflectors can each include one of: distributed Bragg reflector, dielectric reflector, and metal reflector. The first density can vary along a propagation direction in correspondence to an intensity profile of one of the at least one longitudinal optical mode.

In some embodiments, the cross-section can be a longitudinal cross-section of the optical device, the longitudinal cross-section being parallel to a propagation direction of the at least one transverse optical mode. The first density of quantum-confined nanostructures can vary along the propagation direction of the at least one transverse optical mode. The first region can include a plurality of sub-regions having different densities of quantum-confined nanostructures. The optical device can further include a plurality of electrodes electrically coupled to the plurality of sub-regions. During operation, the quantum-confined nanostructures of the plurality of sub-regions can be electrically pumped through the plurality of electrodes, and the optical device can generate laser light corresponding to one of the at least one longitudinal optical mode.

In some embodiments, the cross-section can be a transverse cross-section of the optical device, the transverse cross-section being orthogonal to a propagation direction of the at least one transverse optical mode. The first density of quantum-confined nanostructures can vary along the transverse cross-section in correspondence to an intensity profile of a transverse optical mode of the at least one transverse optical mode.

In some embodiments, the optical device can further include first and second electrodes electrically coupled to the first region. During operation, the first plurality of quantum-confined nanostructures can be electrically pumped through the first and second electrodes and provide an optical gain. During operation, the first plurality of quantum-confined nanostructures can generate a photocurrent in response to light of the at least one transverse optical mode and output the photocurrent through the first and second electrodes.

In some embodiments, the first plurality of quantum-confined nanostructures can include a material selected from the group consisting of Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

In some embodiments, the quantum-confined nanostructures can include at least one of quantum dots, quantum dashes, quantum well, or quantum wires.

In some embodiments, the first region can include a plurality of layers of quantum-confined nanostructures.

In some embodiments, the second region can further include passive optical components.

In another aspect, the disclosure features a method for fabricating an optical device, including: providing a base layer; forming a plurality of quantum-confined nanostructures on first and second regions supported by the base layer, the first and second regions being non-overlapping regions; etching at least a portion of the plurality of quantum-confined nanostructures within the second region by performing a first photoelectrochemical (PEC) etching step that includes exposing the second region to an etchant while illuminating the second region with light at a first wavelength, such that a second density of quantum-confined nanostructures of the second region is lower than a first density of quantum-confined nanostructures of the first region; etching at least a portion of the plurality of quantum-confined nanostructures within the first region by performing a second PEC etching step that includes exposing the first region to an etchant while illuminating the first region with patterned light at the first wavelength, such that the first density varies across a cross-section of the optical device; and forming an optical confinement structure on the base layer, the optical confinement structure being configured to guide at least one transverse optical mode that substantially overlaps with the first region.

Embodiments of the method can include one or more of the following features. For example, forming the plurality of quantum-confined nanostructures on the first and second regions supported by the base layer can include: exposing the first and second regions to a quantum-confined nanostructure forming environment while illuminating the first region with light at a second wavelength.

Among other advantages, power efficiency of semiconductor optical amplifiers or lasers formed from the QC nanostructures may be improved. Dark current of photodetectors formed from the QC nanostructures may be reduced. A SOA with decreased nonlinearity or improved saturation performance may be realized. A transverse mode-selective laser may be realized.

Advantageously, the disclosed device architectures are achievable using wafer processing techniques, enabling compact, integrated form-factors and large-scale manufacturing in an economic manner.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
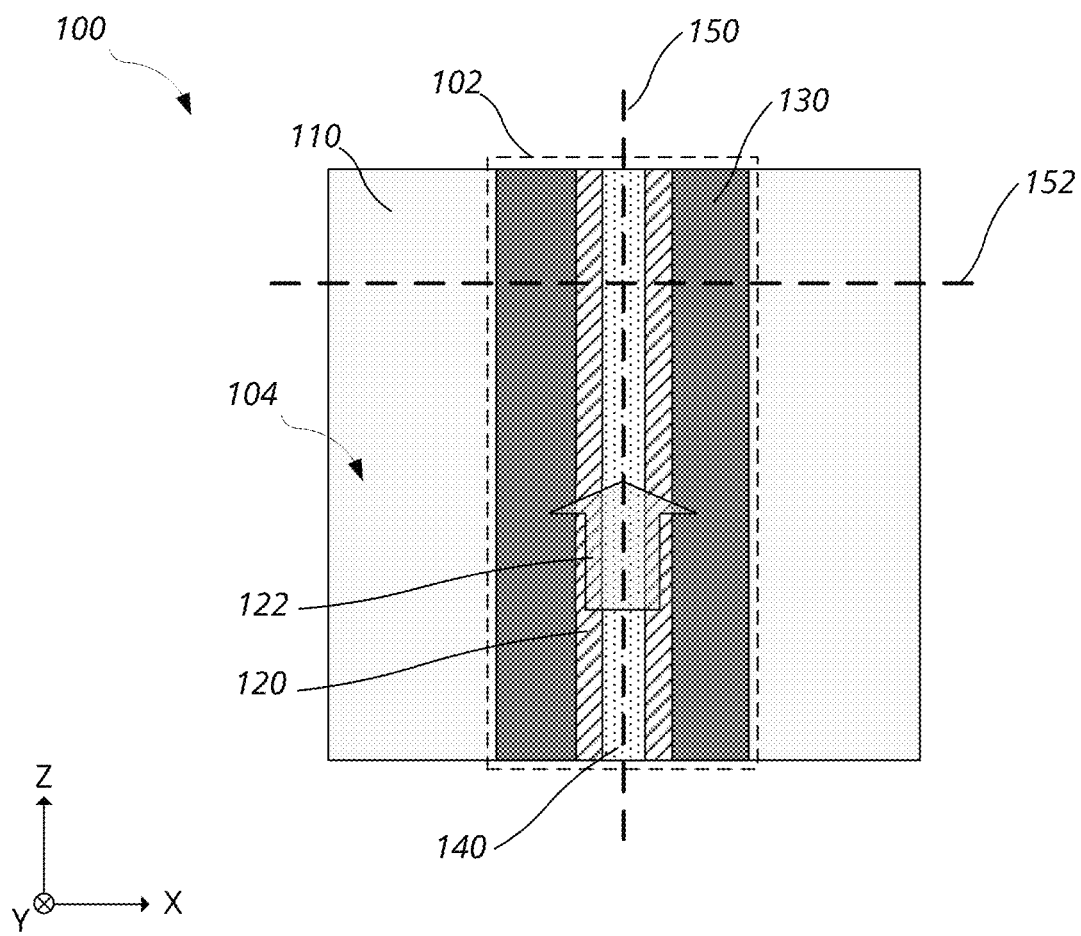
FIGS. 1A and 1B show top and cross-sectional views of an example of an optoelectronic device.
Figure 1B:
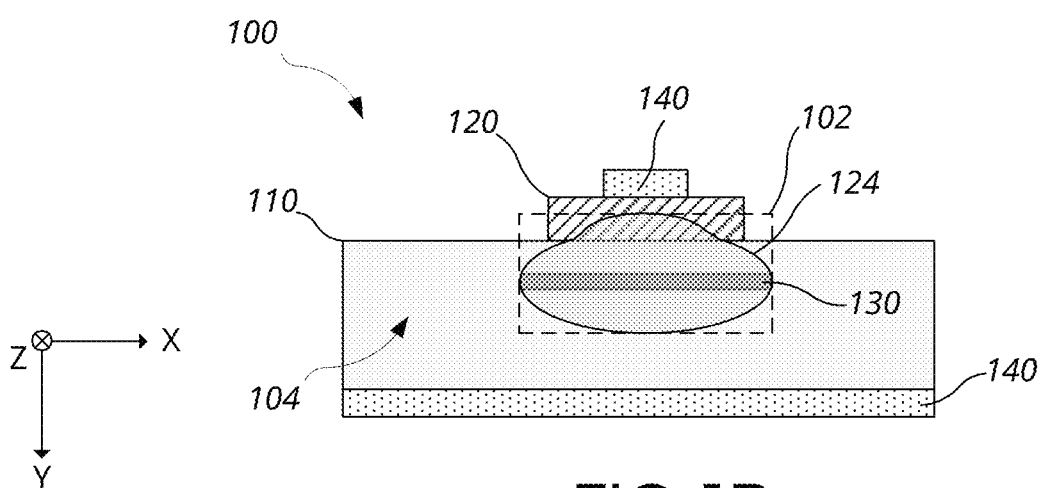

Referring to FIG. 1A and FIG. 1B, an example of an optoelectronic device 100 is shown in top and cross-sectional views, respectively. Cartesian axes are shown for ease of reference. The optoelectronic device 100 includes a first region 102, a second region 104, a base layer 110, an optical confinement structure 120, quantum-confined (QC) nanostructures 130, and electrodes 140. The optoelectronic device 100 interacts with light to provide various optoelectronic functions, such as optical gain, light emission, or light detection.

The base layer 110 provides a suitable base on which the device 100 is fabricated. The base layer 110 may be formed from various crystalline semiconductor materials that are compatible with growth of the QC nanostructures 130. In some implementations, the base layer 110 may be a substrate or a wafer. In some implementations, the base layer 110 may include a buffer layer configured to provide a surface compatible with the growth of the QC nanostructures. The base layer 110 may be sufficiently transparent at an operational wavelength of the device 100.

QC nanostructures 130 are supported by the base layer 110 and are formed from a conducting or semiconducting material, such as compound semiconductors. Examples of materials suitable for formation of QC nanostructures 130 include Gallium Arsenide (GaAs), Aluminum Gallium Arsenide (AlGaAs), Gallium Arsenide Phosphide (GaAsP), Aluminum Gallium Indium Phosphide (AlGaInP), Gallium (III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN). Examples of QC nanostructures 130 include quantum dots, quantum dashes, quantum wells, and quantum wires. The QC nanostructures can be used to provide optical gain or absorb light.

The optical confinement structure 120 in combination with the base layer 110 guides at least one optical mode 122. The optical confinement structure 120 may be formed from a material with similar composition as the base layer 110, or be formed from other materials that are sufficiently transparent at the operational wavelength of the device 100. While the optical confinement structure 120 is illustrated as being separate from the base layer 110, in general, the optical confinement structure 120 may be a part of the base layer 110. For example, the base layer 110 may be etched to form the optical confinement structure 120. As another example, the optical confinement structure 120 may be a doped region of the base layer 110 having higher refractive index relative to the surrounding regions of the base layer 110.

The optical mode 122 has an associated distribution of electric fields, i.e., a mode profile. In order for a material to interact with the optical mode 122, the material generally needs to come in contact with, or be in an optical overlap with, the electric field distribution of the optical mode 122. As such, in order for the QC nanostructures 130 to interact with the optical mode 122, the QC nanostructures 130 needs to overlap with the mode profile of the optical mode 122.

For a given propagation environment as provided by the combination of the optical confinement structure 120 and the base layer 110, the mode profile of the optical mode 122 can be determined throughout the optoelectronic device 100. The propagation environment of the optical mode 122 may include a refractive index profile of a transverse cross-section of the device 100. The mode profile of the optical mode 122 remains substantially the same while propagating through the device 100, given that the propagation environment experienced by the optical mode 122 remains substantially unchanged. As such, a distribution of the QC nanostructures 130 may be designed or be adapted for operation with the optical mode 122 to improve the overlap between the QC nanostructures 130 and the optical mode 122, which may improve the performance of the optoelectronic device 100.

Referring to FIG. 1B, the optical mode 122 has a transverse optical mode profile 124. The transverse optical mode profile 124 is the electric field distribution of the optical mode 122 along a plane perpendicular to a propagation direction of the optical mode 122. In this example, the optical mode 122 is propagating in the +Z direction, and the transverse optical mode profile 124 is defined on the X-Y plane as shown. The transverse optical mode profile 124 is primarily determined by the combined geometry of the optical confinement structure 120 with the base layer 110 and the optical properties of the optical confinement structure 120 and the base layer 110, such as their refractive indices. In this example, the transverse optical mode profile 124 has a generally elliptical shape, with a portion of the mode profile 124 being drawn into the optical confinement structure 120. Based on the mode profile of the optical mode 122, such as the transverse optical mode profile 124, the regions of the device 100 may be characterized into the first region 102, and the second region 104. The first region 102 may correspond to a region of the device 100 that has a substantially large modal overlap with the optical mode 122. The second region 104 may correspond to regions of the device 100 that do not overlap with the first region 102, e.g., the remaining regions of the device 100. As such, the second region 104 may have a lower modal overlap with the optical mode 122 relative to the first region 102.

While the transverse optical mode profile 124 is shown to have a clearly defined edge, such edge is shown only for the purpose of illustration. In general, the transverse optical mode profile 124 has a continuum of electric field values that asymptotically decay to zero in an outward direction from the transverse optical mode profile 124. As such, a region or a portion may be said to "substantially overlap" with the optical mode 122 when a portion of the electric field of the optical mode 122 contained within the region or a portion is greater than a set fraction of the total electric field of the optical mode 122 within that region or portion. For example, the set fraction may be 25%, 50%, 75%, 90%, 95%, or 99%. A region or portion may also be said to "substantially overlap" with the optical mode 122 when an optical intensity (measured in W/cm$^2$) associated with the region or the portion is greater than a set fraction of the maximum optical intensity of the optical mode 122. For example, the set fraction may be 25%, 50%, 75%, 90%, 95%, or 99%. Being in substantial overlap with the optical mode 122 may allow, for example, the region or the portion to affect the various characteristics of the optical mode 122, such as its power, phase, or shape.

Given the transverse optical mode profile 124, the distribution of the QC nanostructures 130 can be designed to increase the modal overlap of the QC nanostructures 130 with the optical mode 122. For example, QC nanostructures 130 may be placed within the first region 102 such that the QC nanostructures 130 have a large modal overlap with the optical mode 122. In the example shown, the QC nanostructures 130 are provided in a layer that terminates at the edge of the first region 102, and no QC nanostructures 130 are present within the second region 104. However, in general, the second region 104 may have a second density of QC nanostructures 130 lower than a first density of QC nanostructures of the first region 102.

For an area density, the first density may generally fall within a range of 0.01 QC nanostructures per µm^2 per layer of QC nanostructures to 100 QC nanostructures per µm^2 per layer of QC nanostructures. The second density may fall within a range of 0 QC nanostructure per µm^2 per layer of QC nanostructures to a value less than the first density. The specific value of the first and second densities may be set based on various characteristics of the device 100, such as the type of the device (e.g., amplifier, laser, photodetector), the target operation wavelength of the device, and target performance parameters of the device (e.g., gain or saturation power for an amplifier device 100). A device in general can have more than 1 layer of QC nanostructures. As such, for a volumetric density, the first density may generally fall within a range of 0.01 QC nanostructures per µm^3 to 1000 QC nanostructures per µm^3, and the second density may fall within a range of 0 QC nanostructure per µm^3 to a value less than the first density.

The density of QC nanostructures may be determined through various imaging and material characterization methods. For example, a layer of QC nanostructures may be imaged using SEM, and the SEM image can be image-processed to count the QC nanostructures in a unit area. As another example, techniques that measure photoluminescence, surface topology, or combination thereof can be used. Examples include atomic force microscopy (AFM) for surface topology, and near-field scanning optical microscope (NSOM) for a technique that combines photoluminescence with the AFM technique.

The electrodes 140 are electrically coupled with at least a portion of the QC nanostructures 130. As an example, one of the electrodes 140 may be supported by the optical confinement structure 120, and another one of the electrodes 140 may be supported by a bottom surface of the base layer 110 opposite to the optical confinement structure 120. The base layer 110 and the optical confinement structure 120 may be formed from electrically conductive materials, such as semiconductors. The base layer 110 and the optical confinement structure 120 may provide an electrical coupling between the electrodes 140 and the first region 102 that includes the QC nanostructures 130. As such, an electrical current may be injected into or collected from the QC nanostructures 130 by the electrodes 140 through the optical confinement structure 120 and the base layer 110.

While a particular arrangement of electrodes 140 has been shown in FIGS. 1A and 1B, in general, the electrodes 140 may be arranged in various locations of the device 100. For example, the electrodes may be placed on a top surface of the base layer 110.

In some implementations, an electrical current is injected to the QC nanostructures 130 through the electrodes 140 to electrically pump the QC nanostructures 130. Electrical pumping of the QC nanostructures 130 may lead to a population inversion of the QC nanostructures 130, leading to generation of an optical gain. The optical gain provided by the QC nanostructures 130 may be used to amplify the optical mode 122. In this type of operation, the device 100 may function, for example, as a semiconductor optical amplifier or as a gain medium of a laser.

In some implementations, the device 100 may be a photodetector, and an electrical current is collected from the QC nanostructures 130 through the electrodes 140. For a photodetector device 100, the QC nanostructures 130 may absorb light of the optical mode 122, and convert the absorbed light into photo-generated carriers, which are collected by the electrodes 140 as a photocurrent.

In various implementations of the device 100, such as the SOA or photodetector implementations, the density of the QC nanostructures 130 may be varied across the device 100 in various ways to improve device performance. For example, the first density of QC nanostructures 130 within the first region 102 may vary across a cross-section of the optoelectronic device 100, such as a longitudinal cross-section or a transverse cross-section of the optoelectronic device 100.

The transverse cross-section of the optoelectronic device 100 refers to a cross-section that is perpendicular to the propagation direction of the optical mode 122. The propagation direction of the optical mode 122 may change across the optoelectronic device 100, for example, according to the trajectory of the optical confinement structure 120. As such, the transverse cross-section may be a cross-section that is parallel to the Y-axis of FIG. 1A and taken in the width direction (e.g., X-axis) of the optical confinement structure 120. For example, the transverse cross-section may be a cross-section taken along a line 152 of FIG. 1A.

The optical mode 122 has an associated transverse optical mode profile 124. As an example, referring to FIG. 1B, the transverse optical mode profile 124 for a fundamental, or a first order, optical mode 122 may have a peak in the electric field intensity toward the center of the transverse optical mode profile 124, and the electric field intensity may decrease in an outward direction from the center. As another example, the transverse optical mode profile 124 for a second order optical mode 122 may have two peaks in the electric field intensity along the X-direction with a local minimum in the electric field intensity located between the two peaks.

As the strength of the interaction of the optical mode 122 with the QC nanostructures 130 is generally proportional to the electric field intensity of the transverse optical mode profile 124, it may be advantageous to vary the density of the QC nanostructures 130 across the transverse cross-section of the optoelectronic device 100 in correspondence to the electric field intensity of the transverse optical mode profile 124. For example, the QC nanostructure density can be varied in proportion to the electric field intensity of the transverse optical mode profile 124 (e.g., linearly proportional, or proportional to the square of the electric field intensity).

Such variation in QC nanostructure density across the transverse cross-section may have various advantages, such as improved power efficiency and mode-selective amplification or detection. Generally, the optoelectronic device 100 may support two or more transverse intensity distributions of the optical modes 122, such as the first order and the second order transverse optical modes. In some applications, selective amplification or detection of one optical mode (e.g., the fundamental mode) over other optical modes (e.g., second order and other higher order modes) may be desired. For example, in a case where the fundamental mode with an intensity peak at the center of the transverse optical mode profile 124 is the desired mode, the QC nanostructure density can be varied to follow the mode profile, resulting in a greater number of QC nanostructures 130 at the center of the mode profile 124. The greater number of QC nanostructures 130 at the center of the mode profile 124 leads to greater amplification or absorption of the fundamental mode in comparison to the second order mode that has a local minimum where the QC nanostructures are present in greater numbers. As such, in case of amplification, the fundamental mode may be amplified to a greater extent than the second order mode, leading to mode-selective amplification. In case of detection, the fundamental mode may be absorbed to a greater extent than the second order mode, leading to mode-selective photodetection.

The longitudinal cross-section of the optoelectronic device refers to a cross-section that is parallel to the propagation direction of the optical mode 122. The propagation direction of the optical mode 122 may change across the optoelectronic device 100, for example, according to the trajectory of the optical confinement structure 120. As such, the longitudinal cross-section may be a cross-section that is parallel to the Y-axis of FIG. 1A and taken along the center of the optical confinement structure 120. For example, the longitudinal cross-section may be a cross-section taken along a line 150 of FIG. 1A.

In a SOA implementation of the optoelectronic device 100, the device 100 amplifies the optical mode 122 as the mode propagates through the device 100 (e.g., in the +Z direction). As such, the optical power of the optical mode 122 may increase as the mode 122 propagates through the device 100. As the optical power of the optical mode 122 increases within the device 100, the mode may experience a phenomenon known as gain saturation that limits or adversely affects the amplification of the optical mode 122. A group of population-inverted QC nanostructures 130 may have a set number of QC nanostructures in the excited state. The excited QC nanostructures returns to a ground state or a non-excited state when photons of the optical mode 122 interacts with the excited QC nanostructures to induce stimulated emissions of photons by the excited QC nanostructures. As such, the optical mode 122 with a high number of photons (i.e., having high optical power) may deplete the excited population of the QC nanostructures 130, reducing or eliminating the population inversion and the associated optical gain.

One way of mitigating the depletion of the excited QC nanostructure population is to increase the density of QC nanostructures 130 within the first region 102, such that more excited QC nanostructures 130 are available for amplification of the optical mode 122. However, increasing the density of QC nanostructures 130 throughout the first region 102 in a uniform manner may increase a power consumption of the device 100 and adversely affect a power efficiency (e.g., total increase in optical power of the optical mode 122 divided by total input electrical power) of the SOA device 100. For example, the optical mode 122 at the beginning section of the SOA device 100 generally has a lower power than the optical mode 122 at a later section of the device 100 due to the progressive amplification of the optical mode 122 by the SOA device 100. As such, a lower density of QC nanostructures 130 may be needed at the beginning section of the SOA device 100 to mitigate the depletion of the excited population, while a higher density of QC nanostructures 130 may be needed at a later section of the SOA device 100 due to the higher optical power of the amplified optical mode 122. Accordingly, in some implementations, the density of the QC nanostructures 130 may be increased from an input end of the device 100 through which light to be amplified is input, to an output end of the device 100 through which the amplified optical mode 122 is output. Such increase in the QC nanostructure density along the propagation direction of the optical mode 122 is an example of an increase in the QC nanostructure density along the longitudinal cross-section of the SOA device 100.

The increase in the QC nanostructure density along the propagation direction may have various functional dependences. Examples of the functional dependences include linear, exponential (e.g., e^x dependence where x is the position along the propagation direction), and various polynomial functions.

In a photodetector implementation of the optoelectronic device 100, the device 100 absorbs the optical mode 122 as the mode propagates through the device 100 (e.g., in the +Z direction). As such, the optical power of the optical mode 122 may decrease as the mode 122 propagates through the device 100. When an optical mode 122 of sufficiently high power is introduced to the photodetector device 100, the photodetector device 100 may experience a phenomenon known as saturation, in which the photocurrent output of the photodetector ceases to be linearly proportional to the power of the optical mode 122 being detected. Such saturation phenomenon may be due to a depletion of QC nanostructures 130 available for absorbing photons. For example, the QC nanostructures 130 that have absorbed photons may become excited with one or more free electron-hole pairs to be collected by the electrodes 140, and the excited QC nanostructures 130 may be unable to absorb additional photons until the excited electron-hole pairs are collected. As such, the optical mode 122 with a high number of photons (i.e., having high optical power) may deplete the population of the QC nanostructures 130 available for absorbing light, leading to incomplete absorption of the optical mode 122, the saturation phenomenon, or a combination thereof.

One way of mitigating the depletion of the QC nanostructure population available for absorption of light is to increase the density of QC nanostructures 130 within the first region 102, such that more unexcited QC nanostructures 130 are available for absorption of the optical mode 122. However, increasing the density of QC nanostructures 130 throughout the first region 102 in a uniform manner may increase a dark current of the device 100 and adversely affect power consumption and noise performance of the photodetector device 100. For example, the optical mode 122 at the beginning section of the photodetector device 100 generally has a higher power than the optical mode 122 at a later section of the device 100 due to the progressive absorption of the optical mode 122 by the photodetector device 100. As such, a higher density of QC nanostructures 130 may be needed at the beginning section of the photodetector device 100 to mitigate the depletion of the QC nanostructures 130 available for absorption, while a lower density of QC nanostructures 130 may be needed at a later section of the photodetector device 100 due to the lower optical power of the optical mode 122. Accordingly, in some implementations, the density of the QC nanostructures 130 may be decreased from an input end of the device 100 through which light to be detected is input, to an output end of the device 100 through which any unabsorbed portion of the optical mode 122 is output. Such decrease in the QC nanostructure density along the propagation direction of the optical mode 122 is an example of a decrease in the QC nanostructure density along the longitudinal cross-section of the photodetector device 100.

The decrease in the QC nanostructure density along the propagation direction may have various functional dependences. Examples of the functional dependences include linear, exponential (e.g., e^-x dependence where x is the position along the propagation direction), and various polynomial functions.

Figure 1C:
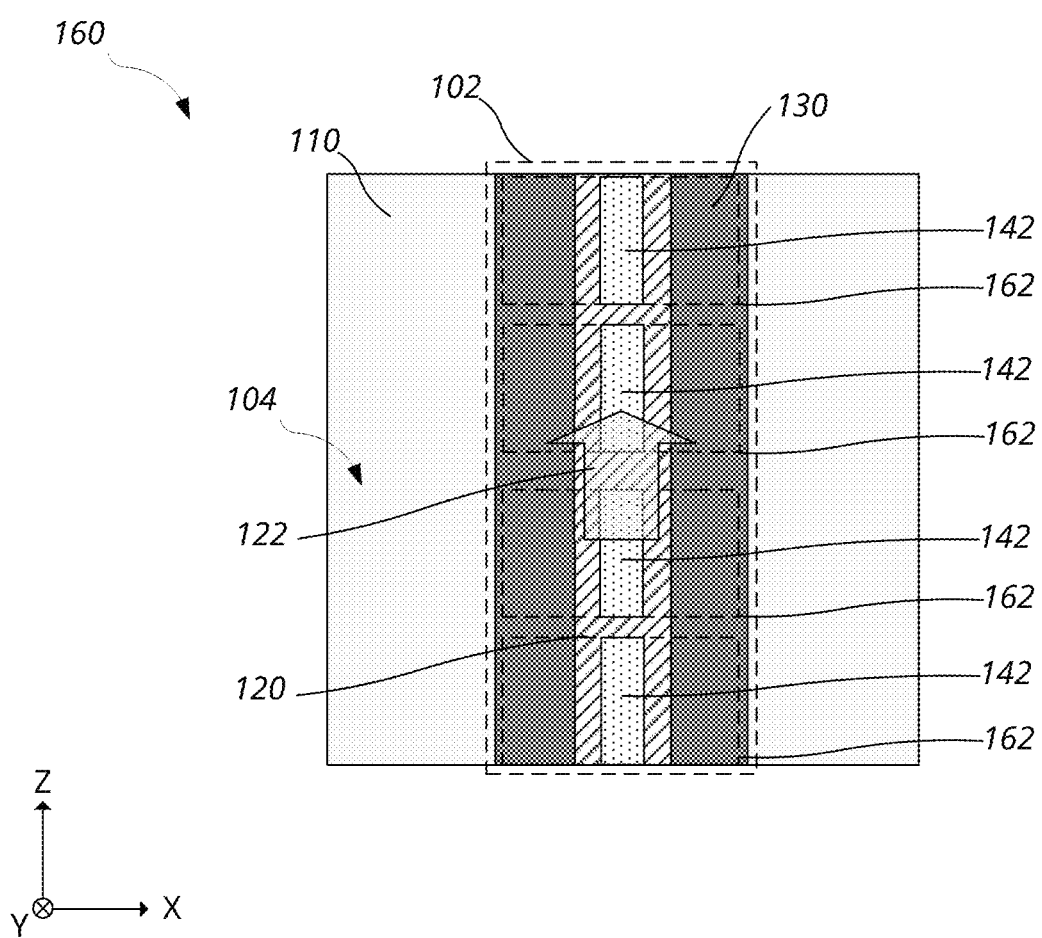
FIG. 1C shows a top view of an example of an optoelectronic device having segmented electrodes.

Referring to FIG. 1C, a top view of an example of an optoelectronic device 160 having segmented electrodes is shown. The optoelectronic device 160 is similar to the optoelectronic device 100 except as described. In some implementations, the electrodes 140 of the device 100 may be segmented into sub-electrodes 142 along the propagation direction (e.g., longitudinal direction) of the optical mode 122. For example, for a SOA device 160 with longitudinally-varying QC nanostructure density, different regions, or sub-regions 162, of the first region 102 along the longitudinal direction may have different densities of QC nanostructures. The sub-regions 162 having different QC nanostructure densities may require different amounts of electrical currents to fully or sufficiently pump the QC nanostructures located within those sub-regions 162. Further, the sub-regions 162 having different QC nanostructure densities may have different electrical characteristics such as resistance. In order to individually control the amount of electrical current provided to the different sub-regions 162 of the first region 102, the electrodes 140 may be segmented into multiple sub-electrodes 142 that correspond to each of the sub-regions 162.

In some implementations, the optoelectronic devices such as devices 100 and 160 may be components of a photonic integrated circuit (PIC). The PIC may share the base layer 110, and further includes various passive optical components that do not require QC nanostructures 130. Examples of the passive optical components include passive waveguide and wavelength multiplexers/demultiplexers. QC nanostructures that are not electrically pumped may absorb light, which increases the optical losses of the passive components if the QC nanostructures are present in regions of the base layer 110 where the passive optical components are located. As such, the passive optical components may be placed in the second region 104 having a low density of or no QC nanostructures 130 to reduce optical losses of the passive optical components and improve the overall performance of the photonic integrated circuit.

While the first region 102 is illustrated to include a single layer of QC nanostructures 130, in general, the first region 102 may include two or more layers of QC nanostructures 130. Multiple layers of QC nanostructures 130 may increase the number of QC nanostructures 130 that are in optical overlap with the optical mode 122. Further, QC nanostructure densities of each layer may be individually controlled to further enhance the control over the overlap between the QC nanostructures 130 and the optical mode 122. For example, a density of the QC nanostructures 130 may be varied in the direction normal to the base layer 110 (e.g., Y-direction).

One or more reflectors may be added to the optoelectronic devices 100 and 160 described in relation to FIGS. 1A through 10 to modify the function of or enhance the performance of the optoelectronic devices. Referring to FIG. 2A, a top view of an example of an optoelectronic device 200 is shown. The optoelectronic device 200 is similar to the optoelectronic device 100, but differs in that a first reflector 210 and a second reflector 212 have been added. The first reflector 210 is disposed on a first end of the device 200, and the second reflector 212 is disposed on a second end of the device 200. The first and second reflectors 210 and 212 are configured to reflect at least some incident light, e.g., the optical mode 122, at a first wavelength, e.g., the wavelength of the optical mode 122.

The first and second reflectors 210 and 212 may form an optical cavity. The optical cavity formed by the first and second reflectors 210 and 212 may have at least one longitudinal optical mode. The device 200 has an optical path length that the optical mode 122 travels through from one end to the other end of the device 200. Based on the optical path length experienced by the optical mode 122 and the wavelength of the optical mode 122, the optical mode 122 may have one or more longitudinal distributions (i.e., longitudinal optical modes) in the electric field intensity. Such longitudinal distributions may be referred to as standing waves, in which the electric field of the optical mode 122 satisfies predetermined boundary conditions at the first and second reflectors 210 and 212.

In implementations where the QC nanostructures 130 are electrically pumped to provide optical gain, the optoelectronic device 200 may be a laser device 200. Spontaneous emissions by the QC nanostructures 130 may be amplified by the QC nanostructures, and the light may propagate and make multiple passes across the optical cavity of the laser device 200 to generate laser light. The wavelength of the generated laser light may be determined by various factors, including the gain spectrum of the QC nanostructures 130, the reflection spectra of the first and second reflectors 210 and 212, and the center wavelengths associated with the longitudinal intensity distributions of the optical mode 122.

In some implementations, the optoelectronic device 200 may be a photodetector device 200. For example, the first reflector 210 may be a partial reflector, and the second reflector 212 may be a high reflectivity reflector. Light may be input to the photodetector device 200 through the partial reflector 210, which propagates through the device 200 as the optical mode 122 and is absorbed by the QC nanostructures 130 during propagation. Any remaining light of the optical mode 122 may be reflected back toward the partial reflector 210 by the high reflectivity reflector 212, and is further absorbed by the QC nanostructures 130. As such, greater portion of the input light may be detected by the photodetector device 200 relative to a comparable device without the reflectors 210 and 212, such as the photodetector device 100. Furthermore, by designing the reflection spectra of the reflectors 210 and 212 and the optical path length of the photodetector device 200 such that wavelengths of the one or more longitudinal distributions of the optical mode 122 matches the wavelength of the input light, a responsivity of the photodetector device 200 may be further enhanced for that particular wavelength or bands of wavelengths.

The first and second reflectors 210 and 212 may be implemented using various structures. Examples of the reflectors include distributed Bragg reflectors, dielectric reflectors, and metal reflectors. Reflection spectra of the reflectors 210 and 212 may be tuned in various ways, including modifying the material, thicknesses, and number of constituent layers of the reflectors, for example.

Figure 2A:
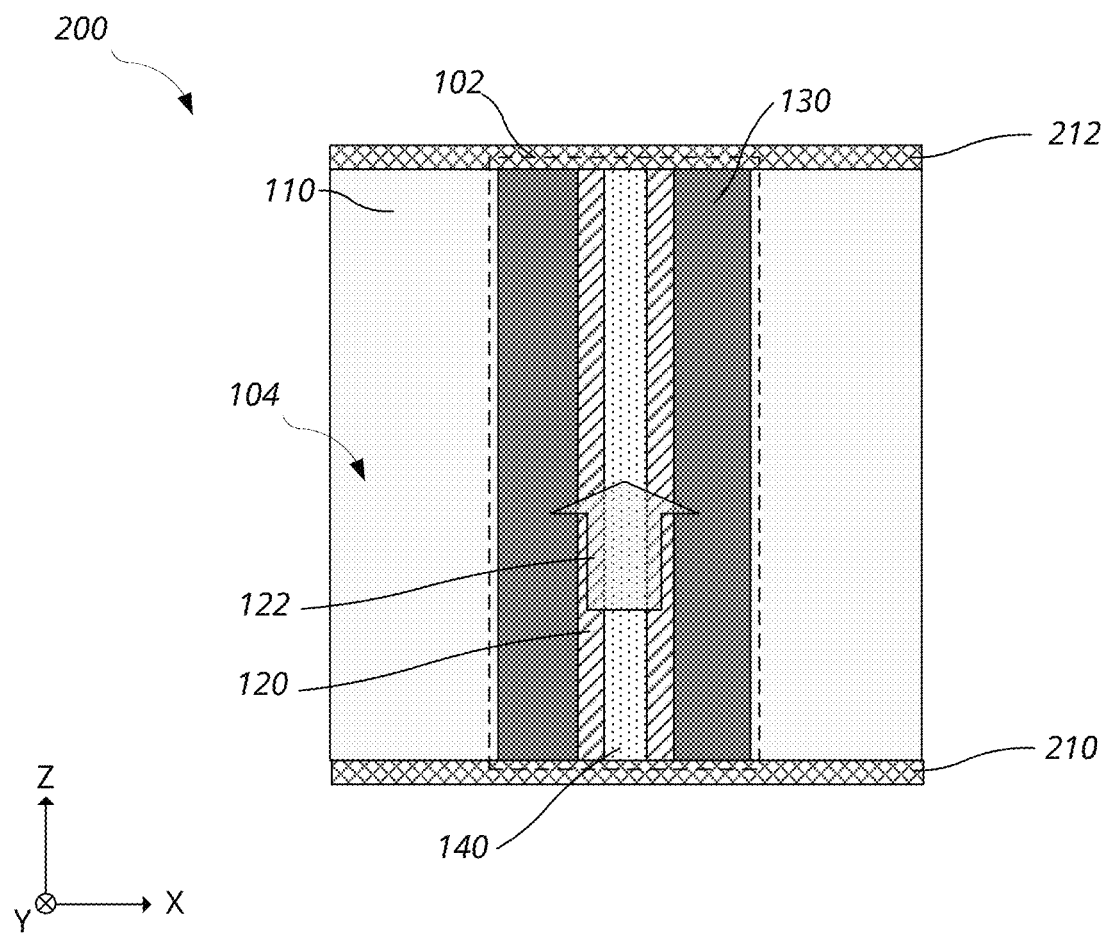
FIGS. 2A and 2B show top and cross-sectional views of examples of an optoelectronic device.
Figure 2B:
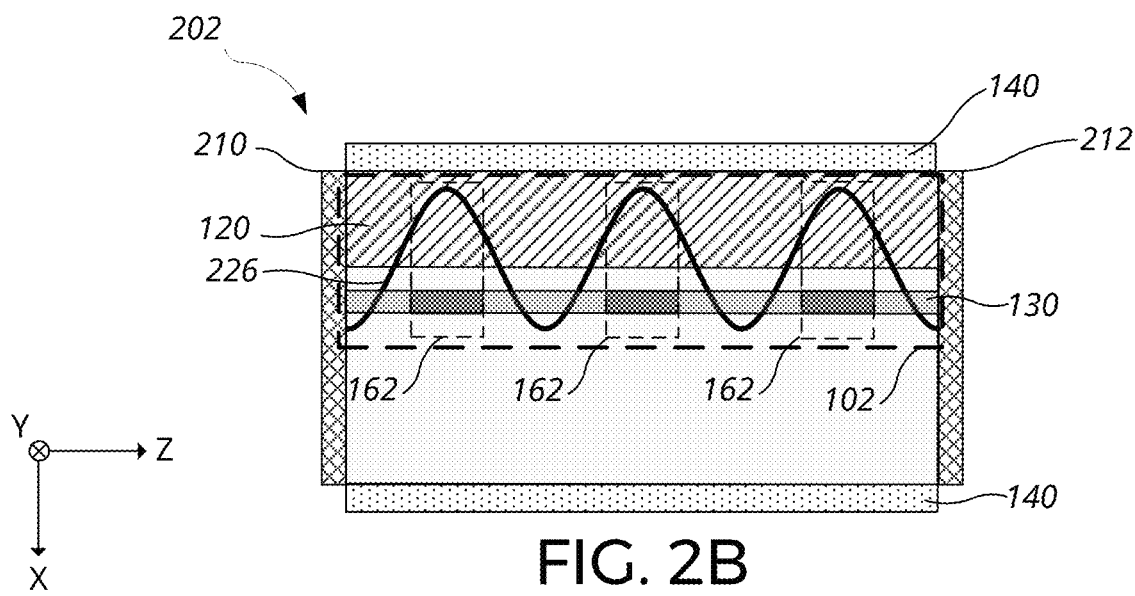

The optoelectronic device 200 has one or more longitudinal distributions of the optical mode 122, which results in a longitudinal variation in the electric field intensity across the longitudinal cross-section of the optoelectronic device 200. Referring to FIG. 2B, a longitudinal cross-section of an optoelectronic device 202 is shown. The device 202 is similar to device 200, but differs in that the first region 102 now has sub-regions 162 having different densities of the QC nanostructures 130. The distribution of the QC nanostructures 130 may be designed or be adapted for operation with the optical mode 122 having a longitudinal optical mode profile 226 to improve the overlap between the QC nanostructures 130 and the optical mode 122, which may improve the performance of the optoelectronic device 202 relative to the optoelectronic device 200.

The longitudinal optical mode profile 226 is a longitudinal distribution of the electric field intensity of the optical mode 122. In this example, the longitudinal optical mode profile 226 has three peaks in intensity across the longitudinal cross-section of the device 202. As such, the densities of the QC nanostructures 130 are varied along the longitudinal cross-section in correspondence to the longitudinal optical mode profile 226. For example, the QC nanostructure density may be increased for the sub-regions 162 of the first region 102 relative to other regions of the first region 102. Such variations of the QC nanostructure densities improve the overlap of the QC nanostructures 130 with the optical mode 122, improving the performance of the device 202.

Such variation in QC nanostructure density across the longitudinal cross-section may have various advantages, such as improved power efficiency and mode-selective lasing or detection. Generally, the optoelectronic device 202 may support two or more longitudinal intensity distributions of the optical modes 122, such as the first order and the second order longitudinal optical modes. In some applications, selective lasing at one longitudinal optical mode (e.g., the third longitudinal mode) over other optical modes (e.g., the first, second, and other higher order modes) may be desired. In case where the optical mode 122 with three intensity peaks in the longitudinal optical mode profile 226 is the desired mode, the QC nanostructure density can be varied to follow the mode profile, resulting in a greater number of QC nanostructures 130 at the intensity peaks of the longitudinal optical mode profile 226. The greater number of QC nanostructures 130 at the peaks of the desired longitudinal mode leads to greater amplification of the desired longitudinal mode in comparison to other longitudinal modes that have different numbers and locations of the intensity peaks. As such, the desired longitudinal optical mode is amplified to a greater extent than other longitudinal modes, which may lead to a longitudinal mode-selective lasing. Such mode-selective lasing may be beneficial in various applications of laser where spectral purity and single mode operation is important.

While longitudinal mode-selective lasing by variation of QC nanostructure density along the longitudinal cross-section of the device 204 is described, the same principle applies to transverse mode-selective by applying the transverse mode-selective amplification described in relation to FIG. 1B.

Figure 2C:
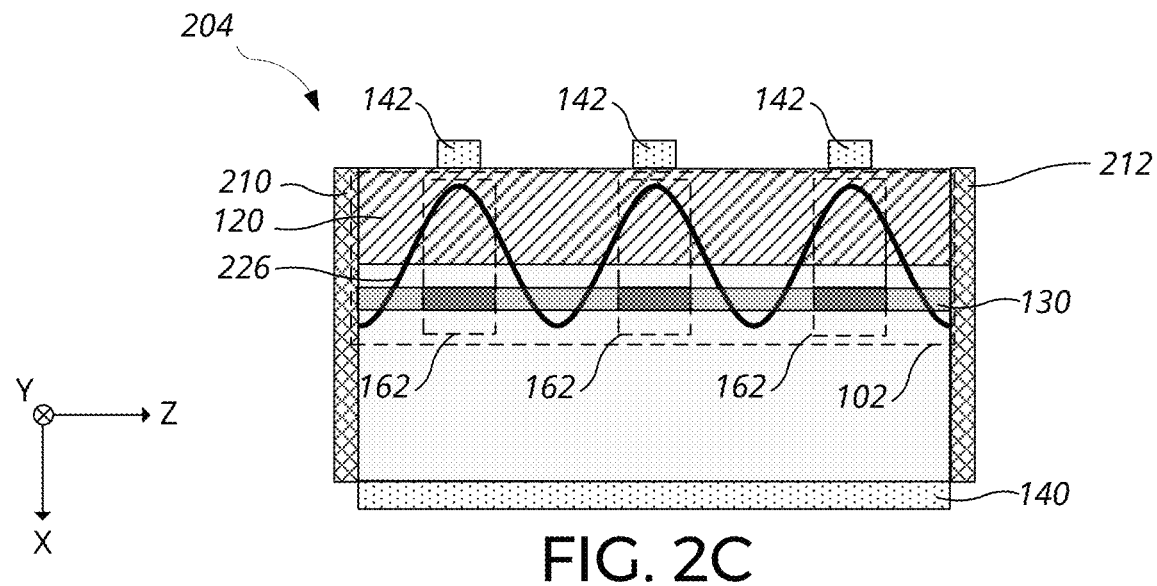
FIG. 2C shows a cross-sectional view of an example of an optoelectronic device having segmented electrodes.

Referring to FIG. 2C, a cross-sectional view of an example of an optoelectronic device 204 having segmented electrodes is shown. The optoelectronic device 204 is similar to the optoelectronic device 202 except as described. In some implementations, one of the electrodes 140 may be segmented into sub-electrodes 142. The segmented sub-electrodes 142 may be individually controlled to provide desired amounts of electrical currents to the QC nanostructures 130 in sub-regions 162. In some implementations, electrical pumping of the different sub-regions 162 may be modified to dynamically select a longitudinal mode for lasing. For example, the middle sub-region 162 may be electrically pumped to provide gain while the left and right sub-regions 162 may be electrically pumped for optical transparency. Such pumping may provide greatest amplification to the fundamental longitudinal mode with a single intensity peak located around the middle sub-region 162, leading to lasing operation of the device 204 at the fundamental longitudinal mode.

While discrete sub-regions 162 have been described, in general, the QC nanostructure density may vary continuously across the longitudinal cross-section in proportion to the longitudinal optical mode profile 226.

Figure 2D:
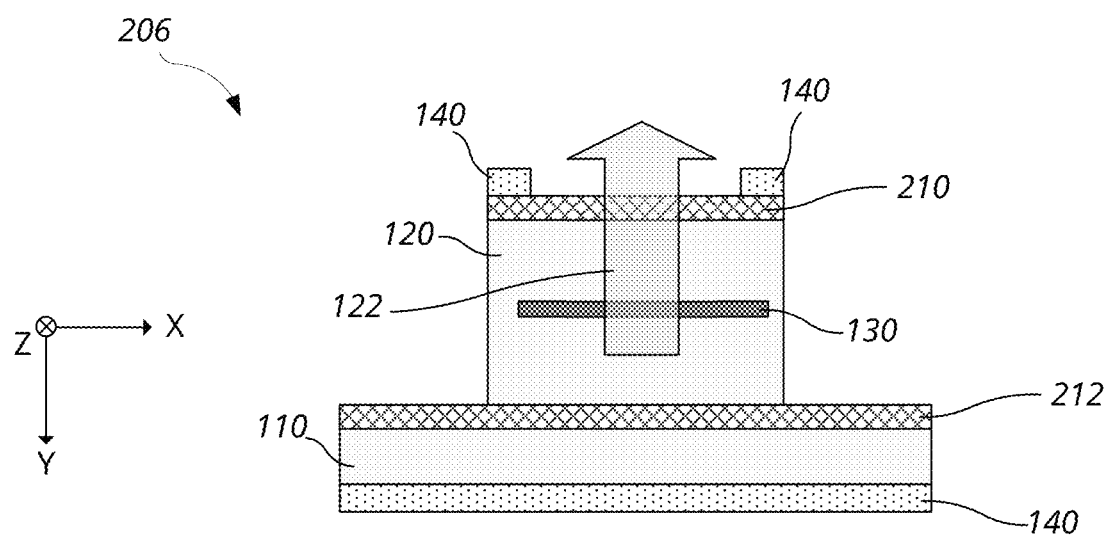
FIG. 2D shows a cross-sectional view of an example of an optoelectronic device.

Referring to FIG. 2D, a cross-sectional view of an example of an optoelectronic device 206 is shown. The optoelectronic device 206 is similar to the optoelectronic device 200, but differs in that the optical confinement structure 120 is now arranged in a direction perpendicular to the top surface of the base layer 110. As such, the propagation direction of the optical mode 122 is now perpendicular to top surface of the base layer, e.g., the −Y direction. The first and second reflectors 210 and 212 are now arranged at the two ends of the optical confinement structure 120, and an optical cavity is formed between the two reflectors 210 and 212 in the vertical direction (e.g., the −Y direction). The optoelectronic device 206 may be referred to as a vertical-cavity surface-emitting laser (VCSEL). By tailoring the density of the QC nanostructures 130 in correspondence to the optical mode 122, power efficiency of the VCSEL may be improved.

A typical VCSEL may lase across multiple transverse optical modes. As such, transverse mode-selective lasing may be achieved by varying the density of the QC nanostructures 130 across the transverse cross-section (e.g., the X-Z plane) in correspondence to the mode profile of the desired transverse optical mode.

So far, various implementations of optoelectronic devices having the first region 102 having a first density of QC nanostructures 130 and the second region 104 having a second density of QC nanostructures 130 have been described. Examples of method for fabricating the optoelectronic devices will now be described.

The base layer 110 is provided. A plurality of QC nanostructures 130 is formed on the first and second regions 102 and 104 supported by the base layer 110, the first and second regions 102 and 104 being non-overlapping regions. QC nanostructures 130 may be formed, for example, by exposing the first and second regions to a QC nanostructure forming environment.

The QC nanostructure forming environment is generally an environment sufficient for causing growth of QC nanostructures 130, such as a gaseous or liquid environment containing the various chemical precursors and/or constituent materials used in forming the QC nanostructures 130. For example, when depositing the QC nanostructures 130 through molecular beam epitaxy (MBE), the forming environment can be a mixture of physical vapor of the constituent material of the QC nanostructures 130, such as indium, gallium, and nitrogen when depositing an InGaN quantum dot. As another example, when depositing the QC nanostructures 130 through metal-organic chemical vapor deposition (MOCVD), the forming environment can be a mixture of various chemical precursors, such as tri-methyl-indium (TMI), tri-methyl-gallium (TMG), ammonia, and nitrogen when depositing an InGaN quantum dot. As yet another example, when depositing the QC nanostructures 130 through liquid phase epitaxy (LPE), the forming environment can be molten liquid of the constituent material of the quantum dots, such as liquid-phase gallium nitride for depositing a GaN quantum dot.

In some implementations, the first region is illuminated with light at a second wavelength while being exposed to the QC nanostructure forming environment. The illumination at the second wavelength may be used to control the growth of the QC nanostructures 130 to control the size and functional characteristics of the QC nanostructures 130. Details of illumination-controlled growth of the QC nanostructures 130 are described in U.S. application Ser. No. 15/851,583 and U.S. application Ser. No. 15/851,602 titled "Multi-color monolithic light-emitting diodes and methods for making the same," which are incorporated by reference herein in their entirety.

At least a portion of the plurality of quantum-confined nanostructures within the second region is etched by performing a first photoelectrochemical (PEC) etching step. The first PEC etching step includes exposing the second region 104 to an etchant while illuminating the second region 104 with light at a first wavelength. PEC etching process selectively etches the QC nanostructures that are illuminated by the light at the first wavelength over the QC nanostructures that are not illuminated. The details of the PEC etching process and other illumination-controlled etching processes are described in U.S. application Ser. No. 15/851,583 and U.S. application Ser. No. 15/851,602 titled "Multi-color monolithic light-emitting diodes and methods for making the same." Removing some or all of the plurality of QC nanostructures 130 located within the second region 104 causes a second density of quantum-confined nanostructures of the second region 104 to be lower than a first density of QC nanostructures of the first region 102.

At least a portion of the plurality of quantum-confined nanostructures within the first region 102 is etched by performing a second PEC etching step. The second PEC etching step includes exposing the first region 102 to an etchant while illuminating the first region 102 with patterned light at the first wavelength. The patterned light has regions of light and regions of no light. As such, QC nanostructures 130 that fall in the light regions is etched while QC nanostructures 130 that fall in the no-light regions of the patterned light are not etched. Accordingly, the density of the QC nanostructures across a cross-section of the optoelectronic device may be varied by controlling the illumination pattern of the patterned light.

While the first and second PEC etching steps are separately described, the first and second PEC etching step may be combined into a single step. For example, the first region 102 and the second region 104 may be simultaneously illuminated with corresponding patterned illumination at the first wavelength and light at the second wavelength while being exposed to the etchant.

The optical confinement structure 120 is formed on the base layer. The optical confinement structure is arranged such that at least one transverse optical mode guided by the optical confinement structure 120 substantially overlaps with the first region.

A number of embodiments have been described. Nevertheless, it will be understood that various modifications may be made without departing from the spirit and scope of the invention. Accordingly, other embodiments are within the scope of the claims.

What is claimed is:

1. An optical device, comprising:
    a base layer;
    a first region supported by the base layer, the first region comprising a first plurality of quantum-confined nanostructures and having a first density of quantum-confined nanostructures;
    a second region supported by the base layer, the first and second regions being non-overlapping regions, the second region having a second density of quantum-confined nanostructures lower than the first density; and
    an optical confinement structure supported by the base layer and configured to guide at least one transverse optical mode between a first end and a second end of the optical confinement structure,
    wherein the first region substantially overlaps with the at least one transverse optical mode, and
    wherein the first density varies across a cross-section of the optical device.

2. The optical device of claim 1, wherein the cross-section is a longitudinal cross-section of the optical device, the longitudinal cross-section being parallel to a propagation direction of the at least one transverse optical mode, and
    wherein the first density of quantum-confined nanostructures varies along the propagation direction of the at least one transverse optical mode.

3. The optical device of claim 2, wherein the first density increases or decreases along the propagation direction of the at least one transverse optical mode in at least a portion of the first region.

4. The optical device of claim 3, wherein the first region comprises a plurality of sub-regions having different densities of quantum-confined nanostructures, and
    wherein the optical device further comprises a plurality of electrodes electrically coupled to the plurality of sub-regions.

5. The optical device of claim 1, further comprising:
    a first reflector disposed at the first end of the optical confinement structure and a second reflector disposed at the second end of the optical confinement structure, wherein the first and second reflectors are configured to reflect at least some incident light at a first wavelength and form an optical cavity having at least one longitudinal optical mode.

6. The optical device of claim 5, wherein the first and second reflectors are arranged along a direction orthogonal to a surface of the base layer.

7. The optical device of claim 5, wherein the first and second reflectors each comprise one of: distributed Bragg reflector, dielectric reflector, and metal reflector.

8. The optical device of claim 5, wherein the first density varies along a propagation direction in correspondence to an intensity profile of one of the at least one longitudinal optical mode.

9. The optical device of claim 5, wherein the cross-section is a longitudinal cross-section of the optical device, the longitudinal cross-section being parallel to a propagation direction of the at least one transverse optical mode,
    wherein the first density of quantum-confined nanostructures varies along the propagation direction of the at least one transverse optical mode,
    wherein the first region comprises a plurality of sub-regions having different densities of quantum-confined nanostructures, and
    wherein the optical device further comprises a plurality of electrodes electrically coupled to the plurality of sub-regions.

10. The optical device of claim 9, wherein during operation, the quantum-confined nanostructures of the plurality of sub-regions are electrically pumped through the plurality of electrodes, and the optical device generates laser light corresponding to one of the at least one longitudinal optical mode.

11. The optical device of claim 1, wherein the cross-section is a transverse cross-section of the optical device, the transverse cross-section being orthogonal to a propagation direction of the at least one transverse optical mode, and
    wherein the first density of quantum-confined nanostructures varies along the transverse cross-section in correspondence to an intensity profile of a transverse optical mode of the at least one transverse optical mode.

12. The optical device of claim 1, further comprising first and second electrodes electrically coupled to the first region.

13. The optical device of claim 12, wherein during operation, the first plurality of quantum-confined nanostructures are electrically pumped through the first and second electrodes and provide an optical gain.

14. The optical device of claim 12, wherein during operation, the first plurality of quantum-confined nanostructures generate a photocurrent in response to light of the at least one transverse optical mode and output the photocurrent through the first and second electrodes.

15. The optical device of claim 1, wherein the first plurality of quantum-confined nanostructures comprises a material selected from the group consisting of Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

16. The optical device of claim 1, wherein the quantum-confined nanostructures comprise at least one of quantum dots, quantum dashes, quantum well, or quantum wires.

17. The optical device of claim 1, wherein the first region comprises a plurality of layers of quantum-confined nanostructures.

18. The optical device of claim 1, wherein the second region further comprises passive optical components.

19. A method for fabricating an optical device, comprising:

providing a base layer;

forming a plurality of quantum-confined nanostructures on first and second regions supported by the base layer, the first and second regions being non-overlapping regions;

etching at least a portion of the plurality of quantum-confined nanostructures within the second region by performing a first photoelectrochemical (PEC) etching step that comprises exposing the second region to an etchant while illuminating the second region with light at a first wavelength, such that a second density of quantum-confined nanostructures of the second region is lower than a first density of quantum-confined nanostructures of the first region;

etching at least a portion of the plurality of quantum-confined nanostructures within the first region by performing a second PEC etching step that comprises exposing the first region to an etchant while illuminating the first region with patterned light at the first wavelength, such that the first density varies across a cross-section of the optical device; and forming an optical confinement structure on the base layer, the optical confinement structure being configured to guide at least one transverse optical mode that substantially overlaps with the first region.

20. The method of claim 19, wherein forming the plurality of quantum-confined nanostructures on the first and second regions supported by the base layer comprises:

exposing the first and second regions to a quantum-confined nanostructure forming environment while illuminating the first region with light at a second wavelength.

* * * * *